(12) United States Patent
Naganuma (10) Patent No.: US 10,923,536 B2
(45) Date of Patent: Feb. 16, 2021

(54) ORGANIC EL DISPLAY DEVICE AND METHOD OF MANUFACTURING ORGANIC EL DISPLAY DEVICE (71) Applicant: Japan Display Inc., Minato-ku (JP)

(72) Inventor: Tomohiko Naganuma, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/531,822

(22) Filed: Aug. 5, 2019

(65) Prior Publication Data
US 2020/0052046 A1 Feb. 13, 2020

(30) Foreign Application Priority Data
Aug. 13, 2018 (JP) .................. 2018-152218

(51) Int. Cl.
H01L 27/32 (2006.01)
H01L 51/56 (2006.01)
H01L 51/50 (2006.01)
H01L 51/00 (2006.01)

(52) U.S. Cl.
CPC ...... H01L 27/3216 (2013.01); H01L 51/5088 (2013.01); H01L 51/56 (2013.01); H01L 27/3244 (2013.01); H01L 51/0011 (2013.01); H01L 2251/558 (2013.01)

(58) Field of Classification Search
CPC ............. H01L 27/3246; H01L 27/3211; H01L 27/322; H01L 51/5056; H01L 51/5088; G09G 2300/0439
USPC ..................................... 257/40, 89
See application file for complete search history.

(56) References Cited

U.S. PATENT DOCUMENTS

| 8,742,430 | B2* | 6/2014 | Shimizu | ................. | B82Y 20/00 |
| | | | | | 257/79 |
| 2007/0231503 | A1* | 10/2007 | Hwang | ................. | C09K 11/06 |
| | | | | | 428/1.1 |
| 2014/0084256 | A1* | 3/2014 | Kim | ....................... | H01L 51/56 |
| | | | | | 257/40 |
| 2014/0284566 | A1* | 9/2014 | Yoo | ..................... | H01L 27/3211 |
| | | | | | 257/40 |
| 2016/0293676 | A1* | 10/2016 | Komatsu | ............. | H01L 27/3213 |

FOREIGN PATENT DOCUMENTS

| JP | 2012-38544 A | 2/2012 |
| JP | 2016-85796 A | 5/2016 |
| JP | 2017-92213 A | 5/2017 |

* cited by examiner

Primary Examiner — Jonathan Han
(74) Attorney, Agent, or Firm — Oblon, McClelland, Maier & Neustadt, L.L.P.

(57) ABSTRACT

An organic EL display device according to an embodiment of the present invention includes: a base material; a plurality of pixels located on the base material; a lower electrode included in each of the plurality of pixels; a bank defining the plurality of pixels; an organic material layer disposed on the lower electrode and on the bank and including a plurality of layers; and an upper electrode disposed on the organic material layer. In a first layer included in the organic material layer, a non-existent region where the first layer is cut off or has a thickness thinner than that of another region is formed, and the non-existent region is formed in at least a portion of an effective region of the pixel surrounded by the bank.

12 Claims, 8 Drawing Sheets

ORGANIC EL DISPLAY DEVICE AND METHOD OF MANUFACTURING ORGANIC EL DISPLAY DEVICE

CROSS-REFERENCE TO RELATED APPLICATION

The present application claims priority from Japanese Application JP 2018-152218 filed on Aug. 13, 2018, the content of which is hereby incorporated by reference into this application.

BACKGROUND OF THE INVENTION

1. Field of the Invention

One or more embodiments of the present invention relate to an organic EL display device and a method of manufacturing an organic EL display device.

2. Description of the Related Art

In recent years, an image display device using a self-luminous body called an organic light emitting diode (OLED) (hereinafter referred to as "organic electro-luminescent (EL) display device") has been put to practical use. Since the self-luminous body is used, the organic EL display device is superior in terms of visibility and response speed compared to, for example, a liquid crystal display device, and in addition, a further reduction in thickness is possible because an illumination device such as a backlight is not necessary.

The organic EL display device includes a display panel in which thin film transistors (TFTs), OLEDs, and the like are formed on a base material. The OLED is configured by disposing, between a pair of electrodes, an organic material layer including a light emitting layer. The organic material layer is typically formed in a region surrounded by a convex bank previously provided for defining pixels. Here, as disclosed in, for example, JP 2016-085796 A or JP 2017-092213 A, a layer constituting the organic material layer is provided common to a plurality of pixels in some cases.

However, when a conductive material is provided common to the plurality of pixels in the formation of the organic material layer, there is a problem in that carriers leak (leakage current flows) between adjacent pixels. Specifically, there is a problem in that an adjacent pixel that should not originally emit light emits light due to the carrier leakage, which causes a reduction in display characteristics (e.g., luminance, contrast, and color purity) or a reduction in luminous efficiency of a pixel that should originally emit light.

SUMMARY OF THE INVENTION

One or more embodiments of the invention have been made in view of the above, it is an object thereof to provide an organic EL display device in which carrier leakage between adjacent pixels is suppressed.

According to one aspect of the invention, an organic EL display device is provided. The organic EL display device includes: a base material; a plurality of pixels located on the base material; a lower electrode included in each of the plurality of pixels; a bank defining the plurality of pixels; an organic material layer disposed on the lower electrode and on the bank and including a plurality of layers; and an upper electrode disposed on the organic material layer. In a first layer included in the organic material layer, a non-existent region where the first layer is cut off or has a thickness thinner than that of another region is formed, and the non-existent region is formed in at least a portion of an effective region of the pixel surrounded by the bank.

According to another aspect of the invention, a method of manufacturing an organic EL display device is provided. The method includes: forming, on a base material, a lower electrode corresponding to each of a plurality of pixels, and a bank defining the plurality of pixels; forming, on the lower electrode and on the bank, an organic material layer including a plurality of layers; and forming an upper electrode on the organic material layer. A first layer included in the organic material layer is formed by depositing a deposition material via a mask having an opening, in the first layer, a non-existent region where the first layer is cut off or has a thickness thinner than that of another region is formed, and the non-existent region is formed in at least a portion of an effective region of the pixel surrounded by the bank.

DETAILED DESCRIPTION OF THE INVENTION

Hereinafter, embodiments of the invention will be described with reference to the drawings. The disclosure is illustrative only. Appropriate modifications that will readily occur to those skilled in the art and fall within the spirit of the invention are of course included in the scope of the invention. In the drawings, for more clarity of description, the width, thickness, shape, and the like of each part may be schematically represented, compared to those in an actual form. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

Figure 1:
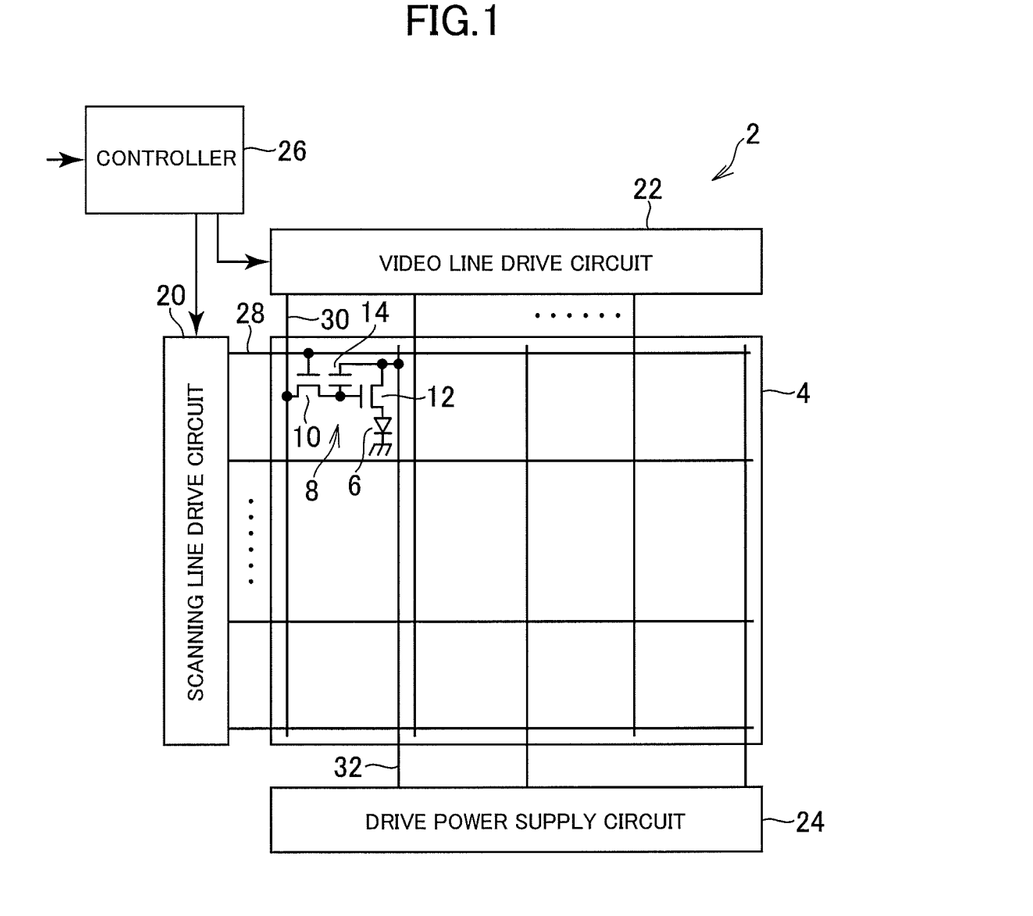
FIG. 1 is a schematic view showing a schematic configuration of an organic EL display device according to one embodiment of the invention.

FIG. 1 is a schematic view showing a schematic configuration of an organic EL display device according to one embodiment of the invention. An organic EL display device 2 includes a pixel array section 4 that displays an image, and a drive section that drives the pixel array section 4. The organic EL display device 2 is configured such that a stacked structure of thin film transistors (TFTs), organic light emitting diodes (OLEDs), and the like is formed on a base material. The schematic view shown in FIG. 1 is one example, and the embodiment is not limited to this example.

In the pixel array section 4, OLEDs 6 and pixel circuits 8 are disposed in a matrix corresponding to pixels. The pixel circuit 8 includes a plurality of TFTs 10 and 12 and a capacitor 14.

The drive section includes a scanning line drive circuit 20, a video line drive circuit 22, a drive power supply circuit 24, and a controller 26. The drive section drives the pixel circuit 8 and controls emission of the OLED 6.

The scanning line drive circuit 20 is connected to scanning signal lines 28 each provided for an array of pixels in the horizontal direction (a pixel row). The scanning line drive circuit 20 sequentially selects the scanning signal line 28 in response to a timing signal input from the controller 26, and applies a voltage for turning on the lighting TFT 10 to the selected scanning signal line 28.

The video line drive circuit 22 is connected to video signal lines 30 each provided for an array of pixels in the vertical direction (a pixel column). The video line drive circuit 22 receives a video signal from the controller 26, and outputs, in synchronization with the selection of the scanning signal line 28 by the scanning line drive circuit 20, a voltage in response to the video signal in the selected pixel row to each of the video signal lines 30. The voltage is written to the capacitor 14 via the lighting TFT 10 in the selected pixel row. The drive TFT 12 supplies a current in response to the written voltage to the OLED 6, and thus the OLED 6 of the pixel corresponding to the selected scanning signal line 28 emits light.

The drive power supply circuit 24 is connected to drive power supply lines 32 each provided for the pixel column, and supplies a current to the OLED 6 via the drive power supply line 32 and the drive TFT 12 in the selected pixel row.

Here, a lower electrode of the OLED 6 is connected to the drive TFT 12. On the other hand, upper electrodes of the OLEDs 6 are composed of an electrode common to the OLEDs 6 of all pixels. When the lower electrode is configured as an anode, a high potential is input thereto and a low potential is input to the upper electrode that serves as a cathode. When the lower electrode is configured as a cathode, a low potential is input thereto and a high potential is input to the upper electrode that serves as an anode.

Figure 2:
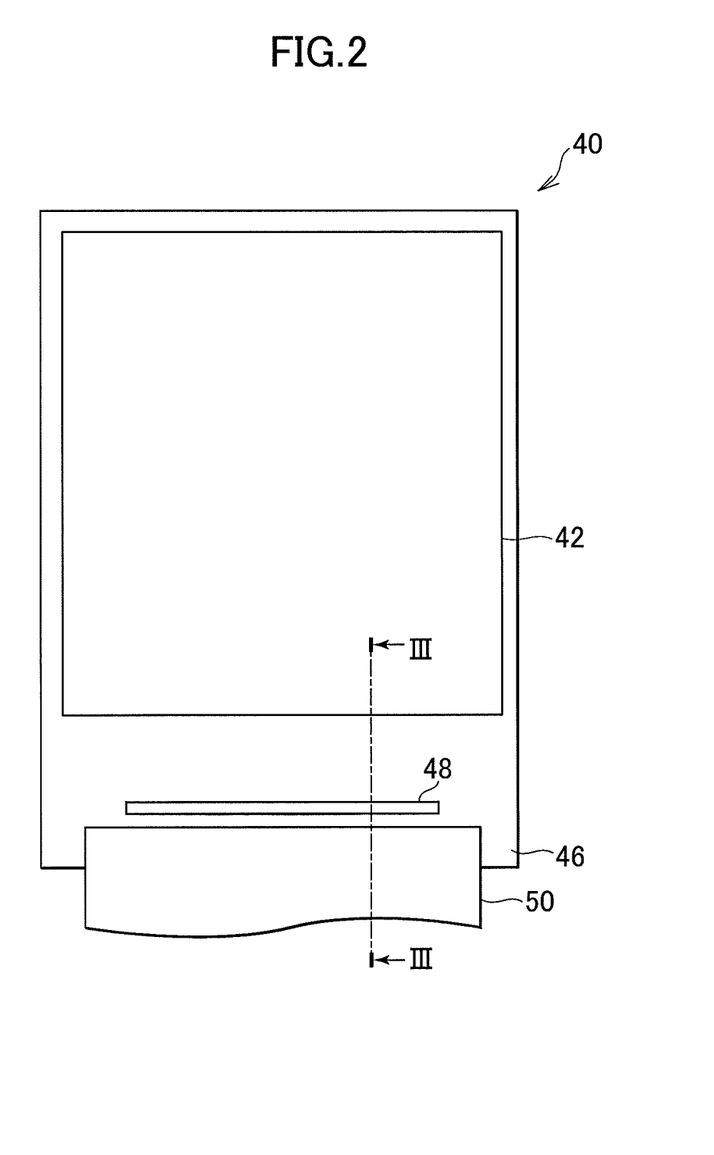
FIG. 2 is a schematic plan view showing one example of a display panel of the organic EL display device shown in FIG. 1.

FIG. 2 is a schematic plan view showing one example of a display panel of the organic EL display device shown in FIG. 1. The pixel array section 4 shown in FIG. 1 is provided in a display region 42 of a display panel 40, and the OLEDs 6 are arranged in the pixel array section 4 as described above. The upper electrode constituting the OLED 6 is formed common to the pixels as described above, and covers the entire display region 42.

A component mounting region 46 is provided at one side of the display panel 40 having a rectangular shape, and wiring lines connecting to the display region 42 are disposed in the component mounting region 46. A driver IC 48 constituting the drive section is mounted in the component mounting region 46, or a flexible printed circuit (FPC) 50 is connected thereto. The FPC 50 is connected to the controller 26, the circuits 20, 22, and 24, and the like, or an IC is mounted on the FPC 50.

Figure 3:
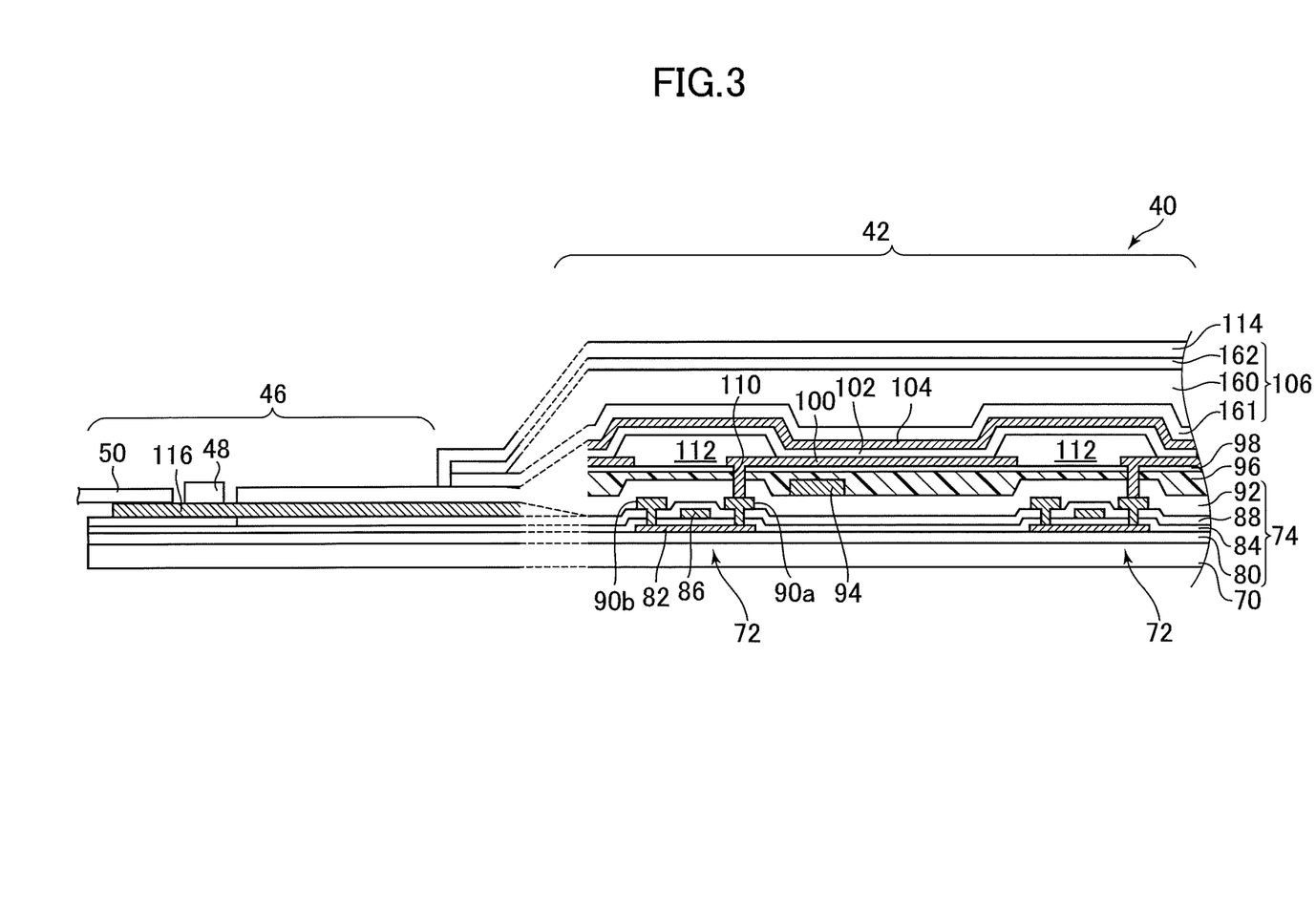
FIG. 3 is a diagram showing one example of a cross section along of FIG. 2.

FIG. 3 is a diagram showing one example of a cross section along III-III of FIG. 2. The display panel 40 has a structure in which a circuit layer 74 including TFTs 72 formed therein, the OLEDs 6, a sealing layer 106 sealing the OLEDs 6, and the like are stacked on a base material 70. The base material 70 is composed of, for example, a glass plate or a resin film including a resin such as a polyimide-based resin. When the base material 70 is composed of the resin film, the base material 70 is formed by, for example, depositing a resin material by coating. A protective film 114 is stacked on the sealing layer 106. Specifically, the protective film 114 in the form of sheet or the form of film is bonded on the sealing layer 106 via an adhesion layer. In the embodiment, the pixel array section 4 is of a top-emission type, and the light generated by the OLED 6 is emitted to the side opposite to the base material 70 side (upward in FIG. 3).

In the circuit layer 74 of the display region 42, the pixel circuit 8, the scanning signal line 28, the video signal line 30, the drive power supply line 32, and the like, which are described above, are formed. At least a portion of the drive section can be formed as the circuit layer 74 on the base material 70 in a region adjacent to the display region 42. As described above, the driver IC 48 which constitutes the drive section and the FPC 50 can be connected to wiring lines 116 of the circuit layer 74 in the component mounting region 46.

As shown in FIG. 3, an under layer 80 formed of an inorganic insulating material is disposed on the base material 70. As the inorganic insulating material, for example, silicon nitride ($SiN_y$), silicon oxide ($SiO_x$), and a complex of these materials are used.

In the display region 42, a semiconductor region 82 serving as a channel portion and a source-drain portion of the TFT 72 of a top-gate type is formed on the base material 70 via the under layer 80. The semiconductor region 82 is formed of, for example, polysilicon (p-Si). The semiconductor region 82 is formed by, for example, providing a semiconductor layer (p-Si film) on the base material 70 and patterning the semiconductor layer to selectively leave places to be used in the circuit layer 74.

A gate electrode 86 is disposed on the channel portion of the TFT 72 via a gate insulating film 84. The gate insulating film 84 is formed typically of TEOS. The gate electrode 86 is formed by, for example, patterning a metal film formed by sputtering or the like. An interlayer insulating layer 88 is disposed on the gate electrode 86 so as to cover the gate electrode 86. The interlayer insulating layer 88 is formed of, for example, the inorganic insulating material described above. An impurity is introduced by ion implantation into the semiconductor region 82 (p-Si) serving as the source-drain portion of the TFT 72, and further, a source electrode 90a and a drain electrode 90b that are electrically connected to the source-drain portion are formed, so that the TFT 72 is configured.

An interlayer insulating film 92 is disposed on the TFT 72. A wiring line 94 is disposed on the surface of the interlayer insulating film 92. The wiring line 94 is formed by, for example, patterning a metal film formed by sputtering or the like. Using the metal film forming the wiring line 94 and the metal film used for the formation of the gate electrode 86, the source electrode 90a, and the drain electrode 90b, for example, the wiring line 116, and the scanning signal line 28, the video signal line 30, and the drive power supply line 32, which are shown in FIG. 1, can be formed to have a multilayer wiring structure. On this configuration, a planarization film 96 and a passivation film 98 are formed, and in the display region 42, the OLED 6 is formed on the passivation film 98. The planarization film 96 is formed of, for example, a resin material. The passivation film 98 is formed of, for example, an inorganic insulating material such as $SiN_y$.

The OLED 6 includes a lower electrode 100, an organic material layer 102, and an upper electrode 104. The OLED 6 is formed typically by stacking the lower electrode 100, the organic material layer 102, and the upper electrode 104 in this order from the base material 70 side. In the embodiment, the lower electrode 100 is an anode of the OLED 6, and the upper electrode 104 is a cathode.

When it is assumed that the TFT 72 shown in FIG. 3 is the drive TFT 12 having an n-channel, the lower electrode 100 is connected to the source electrode 90a of the TFT 72. Specifically, after the formation of the planarization film 96 described above, a contact hole 110 for connecting the lower electrode 100 to the TFT 72 is formed, and for example, by patterning a conductor portion formed on the surface of the planarization film 96 and in the contact hole 110, the lower electrode 100 connected to the TFT 72 is formed for each pixel. The lower electrode 100 is formed of, for example, a transparent metal oxide such as indium tin oxide (ITO) or indium zinc oxide (IZO), or metal such as Ag or Al.

On the structure, a bank 112 defining pixels is disposed. For example, after the formation of the lower electrode 100, the bank 112 is formed at a pixel boundary, and the organic material layer 102 and the upper electrode 104 are stacked in the effective region (a region where the lower electrode 100 is exposed) of the pixel surrounded by the bank 112. The organic material layer 102 typically includes a plurality of layers. Specifically, the organic material layer 102 is formed by stacking a hole transport layer, a light emitting layer, and an electron transport layer in order from the anode side. Moreover, the organic material layer 102 may include another layer. Examples of another layer include, for example, a hole injection layer or electron blocking layer disposed between the anode and the light emitting layer, and an electron injection layer or hole blocking layer disposed between the cathode and the light emitting layer. The upper electrode 104 is composed of a transmitting conductive film. The transmitting conductive film is formed of, for example, an extremely thin alloy of Mg and Ag, or a transparent metal oxide such as ITO or IZO.

The sealing layer 106 is disposed on the upper electrode 104 so as to cover the entire display region 42. The sealing layer 106 has a stacked structure including a first sealing film 161, a sealing planarization film 160, and a second sealing film 162 in this order. The first sealing film 161 and the second sealing film 162 are formed of an inorganic material (e.g., an inorganic insulating material). Specifically, the first sealing film 161 and the second sealing film 162 are formed by depositing a $SiN_y$ film by a chemical vapor deposition (CVD) method. The sealing planarization film 160 is formed using an organic material (e.g., a resin material such as a curable resin composition). On the other hand, the sealing layer 106 is not disposed in the component mounting region 46.

For example, for ensuring the mechanical strength of the surface of the display panel 40, the protective film 114 is stacked on the surface of the display region 42. On the other hand, the protective film 114 is not disposed in the component mounting region 46 for facilitating connection of the IC or the FPC.

Figure 4:
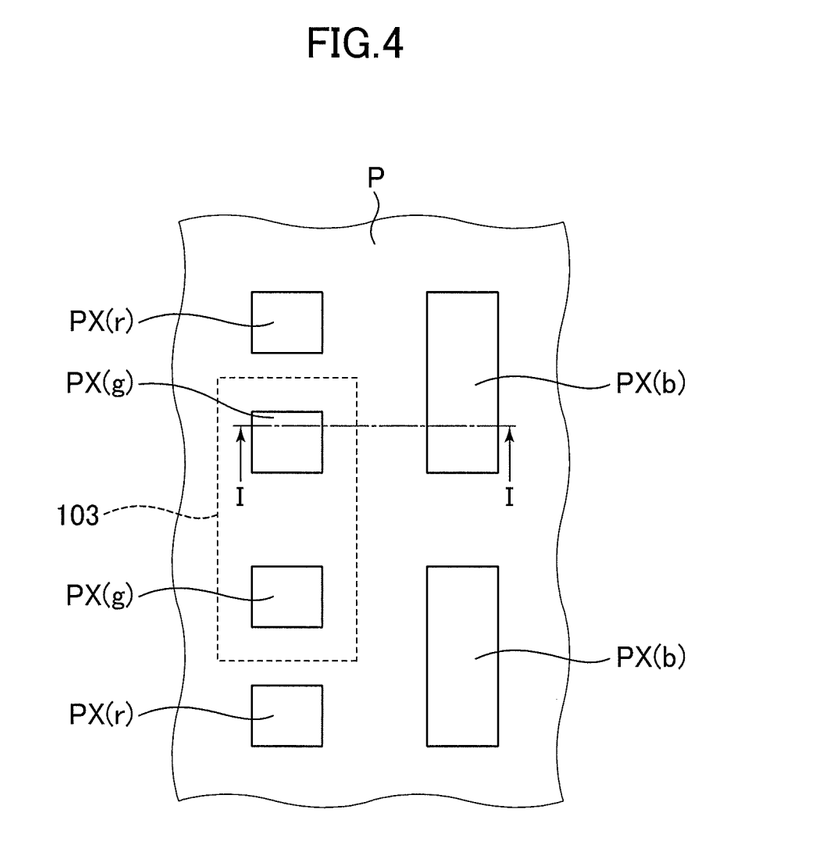
FIG. 4 is a diagram showing one example of the arrangement of pixels of the display panel shown in FIG. 3.

As described above, the display panel 40 includes a plurality of pixels PX arranged side by side in the horizontal direction and the vertical direction in the display region 42. In one example, as shown in FIG. 4, a unit array P of the pixels PX is composed of blue pixels PX (b), green pixels PX (g), and red pixels PX (r). The blue pixels PX (b) are respectively disposed at the upper right and the lower right. The red pixel PX (r) and the green pixel PX (g) are disposed from top, to the left of the blue pixel PX (b) at the upper right. The green pixel PX (g) and the red pixel PX (r) are disposed from top, to the left of the blue pixel PX (b) at the lower right. The luminance of the blue pixel PX (b) tends to be low, and therefore, the pixel area (the opening area of the bank) of the blue pixel PX (b) is designed to be greater than those of the red pixel PX (r) and the green pixel PX (g). The number of pixels constituting the unit array P, the area thereof, and the arrangement thereof are not particularly limited.

Figure 5:
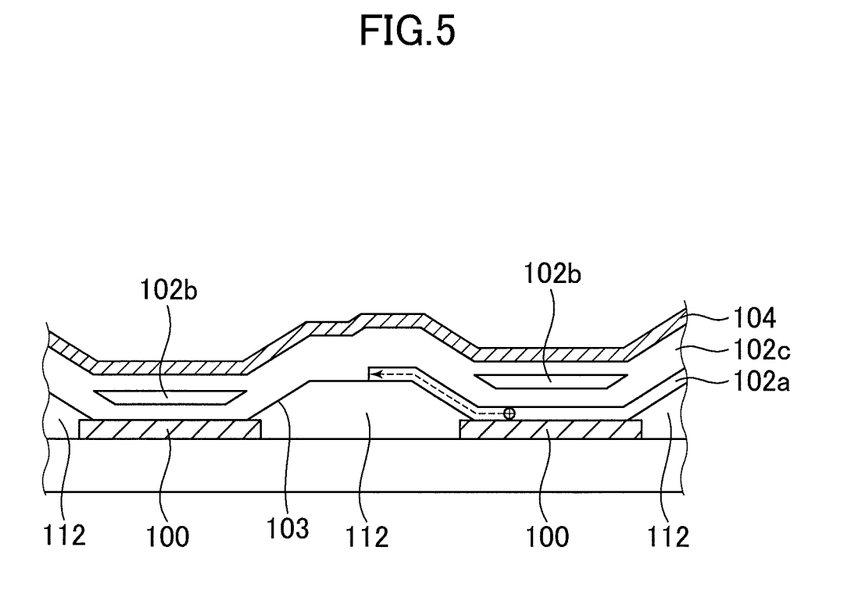
FIG. 5 is a diagram showing a cross section along I-I of FIG. 4.

FIG. 5 is a diagram showing, in an enlarged manner, a portion of the display panel shown in FIG. 3, corresponding to a cross section along I-I of FIG. 4. In FIG. 5, the structures disposed below the lower electrode 100 shown in FIG. 3 are shown in a simplified manner as a lower structure layer 108, and the structures disposed on the upper electrode 104 are omitted.

The bank 112 is provided corresponding to each of the pixels PX, and electrically isolates the lower electrodes 100. The bank 112 is formed so as to cover the peripheral edge of the lower electrode 100 from the upper surface to the side surface. The bank 112 is formed typically using an organic insulating material (e.g., a resin material such as a photosensitive resin composition). The side surface of the bank 112 includes an inclined surface that is inclined to the lower structure layer 108 (the base material 70) side toward the lower electrode 100 side.

Some layers included in the organic material layer 102 are provided common to the pixels PX. Specifically, some layers included in the organic material layer 102 are provided not only on the upper surface of the lower electrode 100 but also on the bank 112, and are continuously provided from the upper surface of the lower electrode 100 over the side surface of the bank 112. On the other hand, light emitting layers 102b included in the organic material layer 102 are formed in the effective regions of the pixels PX using materials corresponding to the respective pixels PX (by separate coloring). The light emitting layers 102b are, for example, individually formed by evaporation using a mask.

The organic material layer 102 includes, as the lowermost layer (layer on the lower electrode 100 side), a hole injection layer 102a. The hole injection layer 102a is formed of, for example, an allylamine-based material. The thickness of the hole injection layer 102a is, for example, from 5 nm to 20 nm. The hole injection layer 102a is cut off, and is provided in the effective region of not all of the pixels PX. Specifically, the hole injection layer 102a includes a non-existent region 103. In the illustrated example, as shown by the broken line in FIG. 4, the non-existent region 103 of the hole injection layer 102a is formed so as to surround the green pixels PX (g). Here, the term "non-existent" includes a state where the hole injection layer 102a is not substantially formed. Specifically, it also includes a state where the resistance is high in a state where the thickness is thinner (e.g., 3 nm or less) than that of another region. From the viewpoint of hole injection, it is difficult to use a material having a high resistance for the hole injection layer 102a in contact with the lower electrode 100, and carrier leakage is likely to occur between adjacent pixels. In the hole injection layer 102a described above, the non-existent region 103 is formed in the effective region of the pixel, so that the entry of carriers into an adjacent pixel may be effectively suppressed. Moreover, this may also contribute to higher definition.

Examples of a layer constituting another layer 102c included in the organic material layer 102 include a hole transport layer, an electron blocking layer, a hole blocking layer, an electron transport layer, and an electron injection layer. The layers constituting the organic material layer 102 are successively formed, for example, by a coating method such as a spin-coating method or an evaporation method.

The hole injection layer 102a having the non-existent region 103 is formed by, for example, depositing a deposition material by evaporation or the like via a mask having an opening. The deposition material may intrude from the opening to the inside of the mask at the time of deposition, and the hole injection layer 102a may be formed at, in addition to the opening of the mask, the intrusion portion on the inside of the mask. At the intrusion portion, the thickness of the hole injection layer 102a may be formed to be thin compared to the thickness of the hole injection layer 102a at the opening of the mask. Therefore, at the intrusion portion, the resistance of the hole injection layer 102a is high, and thus carrier leakage may be suppressed. When the distance between adjacent opening patterns is short in the mask, the effect of suppressing carrier leakage due to a thinner film of the hole injection layer 102a to be obtained may be expected.

As shown in FIG. 4, when the pixel area (the opening area of the bank) varies depending on the luminescent color, the degree of carrier leakage varies. Specifically, the smaller the pixel area of the pixel is, the greater the ratio of a pixel outer peripheral length to the pixel area is, and therefore, the more susceptible the pixel having a small pixel area is to carrier leakage from an adjacent pixel. Hence, in one embodiment, the non-existent region 103 of the hole injection layer 102a is formed for the green pixel PX (g) and/or the red pixel PX (r) having a small pixel area. In the example shown in FIG. 4, the non-existent region 103 of the hole injection layer 102a is formed for the green pixel PX (g), which tends to have high visibility.

Moreover, the shorter the distance between adjacent pixels is, the more susceptible the pixel is to carrier leakage from the adjacent pixel. In the example shown in FIG. 4, the distance between the green pixel PX (g) and the red pixel PX (r) is shorter than the distance between the blue pixel PX (b) and the red pixel PX (r). In the illustrated example, the hole injection layer 102a is cut off between the green pixel PX (g) having a short pixel-to-pixel distance with respect to the red pixel PX (r) and the red pixel PX (r). The non-existent region 103 of the hole injection layer 102a may be formed for all of the green pixels PX (g), or may be formed for a portion of the green pixels PX (g).

Figure 6:
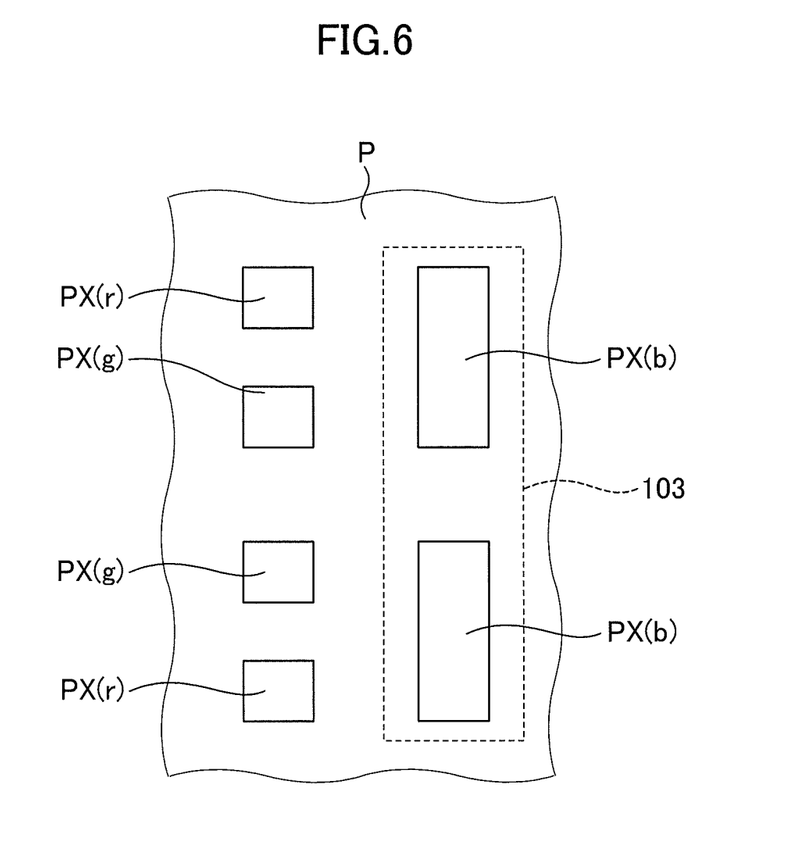
FIG. 6 is a diagram showing Modified Example 1 of the arrangement of pixels of the display panel shown in FIG. 3.

FIG. 6 is a diagram showing Modified Example 1 of the arrangement of pixels of the display panel shown in FIG. 3. In general, the drive voltage varies depending on the luminescent color, and for example, the drive voltage of the blue pixel PX (b) is higher than those of the green pixel PX (g) and the red pixel PX (r). The higher the drive voltage of the pixel is, the more likely the pixel is to exert the influence of carrier leakage on an adjacent pixel. Hence, in the modified example, the non-existent region 103 of the hole injection layer 102a is formed for the blue pixel PX (b) whose drive voltage is high. The non-existent region 103 may be formed for all of the blue pixels PX (b), or may be formed for a portion of the blue pixels PX (b).

Figure 7:
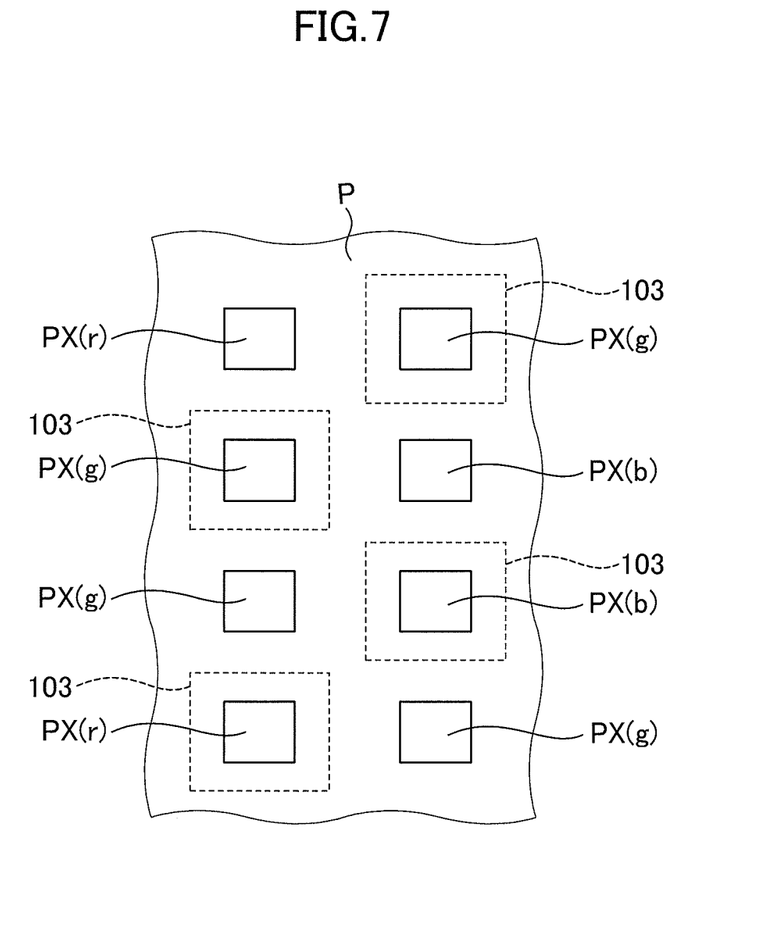
FIG. 7 is a diagram showing Modified Example 2 of the arrangement of pixels of the display panel shown in FIG. 3.

FIG. 7 is a diagram showing Modified Example 2 of the arrangement of pixels of the display panel shown in FIG. 3. In the modified example, the unit array P of the pixels PX (g), is composed of the blue pixels PX (b), the green pixels PX (g), and the red pixels PX (r), which are disposed in a grid-like manner, with no differences among the pixel areas of the pixels PX. Specifically, on the right side, the green pixel PX (g), the blue pixel PX (b), the blue pixel PX (b), and the green pixel PX (g) are disposed in this order from top; and on the left side, the red pixel PX (r), the green pixel PX (g), the green pixel PX (g), and the red pixel PX (r) are disposed in this order from top.

In one embodiment, in consideration of display characteristics of the entire display panel 40, the non-existent region 103 is formed in the hole injection layer 102a regardless of a specific color. In the example shown in FIG. 7, the non-existent region 103 of the hole injection layer 102a is formed for every other pixel in the pixel row and the pixel column so as to form a checkered pattern. According to the configuration described above, carrier leakage to an adjacent pixel can be most effectively suppressed.

Figure 8:
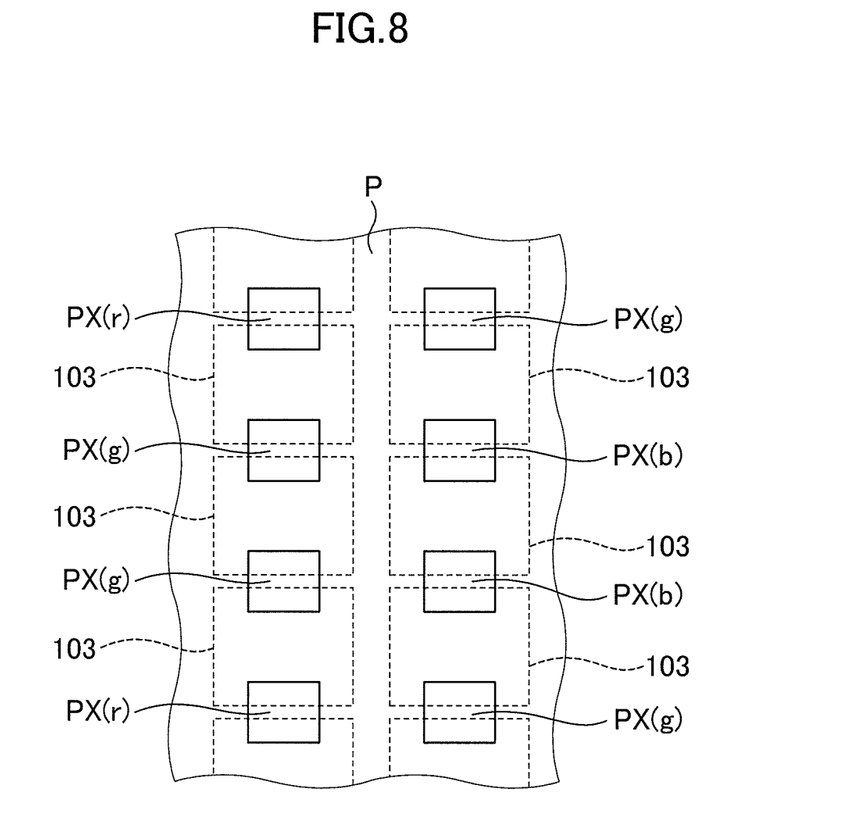
FIG. 8 is a diagram showing Modified Example 3 of the arrangement of pixels of the display panel shown in FIG. 3.

FIG. 8 is a diagram showing Modified Example 3 of the arrangement of pixels of the display panel shown in FIG. 3. In the modified example, the non-existent region 103 of the hole injection layer 102a is formed at the upper edge portion and the lower edge portion of each of the pixels PX. Specifically, the non-existent region 103 is disposed to straddle a portion of the peripheral edge of each of the pixels PX (the banks 112), and the hole injection layer 102a is formed at the center portion of the pixel PX. According to the configuration described above, carrier leakage from the pixels located above and below the pixel, and/or to the pixels located above and below the pixel may be suppressed. In the illustrated example, the non-existent region 103 is formed for all of the pixels PX; however, an embodiment in which the non-existent region 103 is formed for a portion of the pixels PX may be employed.

The invention is not limited to the embodiments, and various modifications can be made. For example, the configuration described in the embodiments can be replaced with substantially the same configuration, a configuration providing the same operational effect, or a configuration capable of achieving the same object. Specifically, although, in the embodiments, the non-existent region has been illustrated as being formed in the hole injection layer, the non-existent region may be formed in another layer (e.g., the electron blocking layer) of the organic material layer.

Various altered and modified examples within the range of the idea of the invention will occur to those skilled in the art, and it is understood that the altered and modified examples also belong to the scope of the invention. For example, when those skilled in the art appropriately add or remove a component or change the design of a component in each embodiment described above, or add or omit a step or change the conditions of a step therein, those are included in the scope of the invention as long as they include the spirit of the invention.

What is claimed is:

1. An organic EL display device comprising:
a base material;
a plurality of pixels located on the base material;
a lower electrode included in each of the plurality of pixels;
a bank defining the plurality of pixels;
an organic material layer disposed on the lower electrode and on the bank and including a plurality of layers; and
an upper electrode disposed on the organic material layer, wherein
in a first layer included in the organic material layer, a non-existent region where the first layer is cut off or has a thickness thinner than that of another region is formed, and the non-existent region is formed in at least a portion of an effective region of the pixel surrounded by the bank, the non-existent region is formed for a pixel of a first color, and is not formed for a pixel of a second color having a pixel area larger than that of the first color, wherein the second color is blue.

2. The organic EL display device according to claim 1, wherein the non-existent region is formed to straddle a peripheral edge of the bank.

3. The organic EL display device according to claim 1, wherein the first layer includes a hole injection layer.

4. An organic EL display device comprising:

a base material;

a plurality of pixels located on the base material;

a lower electrode included in each of the plurality of pixels;

a bank defining the plurality of pixels;

an organic material layer disposed on the lower electrode and on the bank and including a plurality of layers; and an upper electrode disposed on the organic material layer, wherein in a first layer included in the organic material layer, a non-existent region where the first layer is cut off or has a thickness thinner than that of another region is formed, and the non-existent region is formed in at least a portion of an effective region of the pixel surrounded by the bank, wherein the non-existent region is formed for every other one of a plurality of pixels arranged in a first direction.

5. The organic EL display device according to claim 4, wherein the non-existent region is formed to straddle a peripheral edge of the bank.

6. The organic EL display device according to claim 4, wherein the first layer includes a hole injection layer.

7. A method of manufacturing an organic EL display device, comprising:

forming, on a base material, a lower electrode corresponding to each of a plurality of pixels, and a bank defining the plurality of pixels;

forming, on the lower electrode and on the bank, an organic material layer including a plurality of layers; and forming an upper electrode on the organic material layer, wherein a first layer included in the organic material layer is formed by depositing a deposition material via a mask having an opening, in the first layer, a non-existent region where the first layer is cut off or has a thickness thinner than that of another region is formed, and the non-existent region is formed in at least a portion of an effective region of the pixel surrounded by the bank, the non-existent region is formed for a pixel of a first color, and is not formed for a pixel of a second color having a pixel area larger than that of the first color, wherein the second color is blue.

8. The manufacturing method according to claim 7, wherein the non-existent region is formed to straddle a peripheral edge of the bank.

9. The manufacturing method according to claim 7, wherein the first layer includes a hole injection layer.

10. A method of manufacturing an organic EL display device, comprising:

forming, on a base material, a lower electrode corresponding to each of a plurality of pixels, and a bank defining the plurality of pixels;

forming, on the lower electrode and on the bank, an organic material layer including a plurality of layers; and forming an upper electrode on the organic material layer, wherein a first layer included in the organic material layer is formed by depositing a deposition material via a mask having an opening, in the first layer, a non-existent region where the first layer is cut off or has a thickness thinner than that of another region is formed, and the non-existent region is formed in at least a portion of an effective region of the pixel surrounded by the bank, wherein the non-existent region is formed for every other one of a plurality of pixels arranged in a first direction.

11. The manufacturing method according to claim 10, wherein the non-existent region is formed to straddle a peripheral edge of the bank.

12. The manufacturing method according to claim 10, wherein the first layer includes a hole injection layer.

* * * * *